US008699295B2

(12) United States Patent
Lee et al.

(10) Patent No.: US 8,699,295 B2
(45) Date of Patent: Apr. 15, 2014

(54) SEMICONDUCTOR MEMORY DEVICE AND DRIVING METHOD THEREOF

(75) Inventors: Myoung-Jin Lee, Gyeonggi-do (KR); Jin-Hong An, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/564,842

(22) Filed: Aug. 2, 2012

(65) Prior Publication Data

US 2012/0314525 A1 Dec. 13, 2012

Related U.S. Application Data

(62) Division of application No. 12/544,807, filed on Aug. 20, 2009, now Pat. No. 8,259,529.

(30) Foreign Application Priority Data

Aug. 21, 2008 (KR) .................. 10-2008-0081989
Aug. 20, 2009 (KR) .................. 10-2009-0077212

(51) Int. Cl.
*G11C 8/08* (2006.01)
*G11C 8/00* (2006.01)
(52) U.S. Cl.
USPC ............ 365/230.06; 365/230.03; 365/185.18; 365/185.17
(58) Field of Classification Search
USPC ............ 365/230.06, 230.03, 185.02, 185.17, 365/185.03
See application file for complete search history.

(56) References Cited

U.S. PATENT DOCUMENTS

| 6,459,612 | B2 | 10/2002 | Satoh et al. |
| 7,254,084 | B2 * | 8/2007 | Terasawa et al. ............. 365/229 |
| 7,952,938 | B2 | 5/2011 | Kathawala et al. |
| 8,320,184 | B2 | 11/2012 | Yang et al. |
| 2002/0163033 | A1 | 11/2002 | Sugawara et al. |
| 2004/0156255 | A1 * | 8/2004 | Tsukikawa .................. 365/206 |

FOREIGN PATENT DOCUMENTS

CN 1663046 8/2005

OTHER PUBLICATIONS

Office Action issued by the State Intellectual Property Office of People's Republic of China on Oct. 22, 2012.
Search Report issued by the Taiwanese Intellectual Property Office on Jun. 10, 2013.
Notice of Allowance issued by the USPTO for another divisional U.S. Appl. No. 13/564,864 of the parent U.S. Appl. No. 12/544,807 on Jul. 25, 2013.

* cited by examiner

*Primary Examiner* — Toan Le
(74) *Attorney, Agent, or Firm* — IP & T Group LLP

(57) ABSTRACT

A semiconductor memory device includes a plurality of wordlines and a driver configured to, when an wordline of the plurality of wordlines is activated by an active command, drive at least one non-activated wordline neighboring the activated wordline and remaining non-activated wordlines with different wordline driving voltage levels during a period of time that the activated wordline is driven to a high voltage level.

9 Claims, 16 Drawing Sheets

| $FX_k$ | $FX_{k+1}$ | $FXVSS_k$ |
|---|---|---|
| 0 | 0 | $V_{SS}$ |
| 0 | 1 | $V_{NWL}$ |
| 1 | 0 | $V_{NWL}$ |
| 1 | 1 | UNDEFINED |

| FX$_{k-1}$ | FX$_k$ | FX$_{k+1}$ | FXVSS$_k$ |
|---|---|---|---|
| 0 | 0 | 0 | V$_{SS}$ |
| 0 | 0 | 1 | V$_{NWL}$ |
| 0 | 1 | 0 | V$_{NWL}$ |
| 0 | 1 | 1 | UNDEFINED |
| 1 | 0 | 0 | V$_{NWL}$ |
| 1 | 0 | 1 | UNDEFINED |
| 1 | 1 | 0 | UNDEFINED |
| 1 | 1 | 1 | UNDEFINED |

| $FX_k$ | $FX_{k+1}$ | $MWLB_j$ | $FXVSS_{k \times j}$ |
|---|---|---|---|
| 0 | 0 | 0 | $V_{SS}$ |
| 0 | 1 | 0 | $V_{NWL}$ |
| 1 | 0 | 0 | $V_{NWL}$ |
| 1 | 1 | 0 | UNDEFINED |
| X | X | 1 | $V_{SS}$ |

| FX$_{k-1}$ | FX$_k$ | FX$_{k+1}$ | MWLB$_j$ | FXVSS$_{k \times j}$ |
|---|---|---|---|---|
| 0 | 0 | 0 | 0 | V$_{SS}$ |
| 0 | 0 | 1 | 0 | V$_{NWL}$ |
| 0 | 1 | 0 | 0 | V$_{NWL}$ |
| 0 | 1 | 1 | 0 | UNDEFINED |
| 1 | 0 | 0 | 0 | V$_{NWL}$ |
| 1 | 0 | 1 | 0 | UNDEFINED |
| 1 | 1 | 0 | 0 | UNDEFINED |
| 1 | 1 | 1 | 0 | UNDEFINED |
| X | X | X | 1 | V$_{SS}$ |

| FX$_k$ | FX$_{k+1}$ | MWLB$_j$ | MWLVSS$_{k \times j}$ |
|---|---|---|---|
| 0 | 0 | 0 | V$_{SS}$ |
| 0 | 1 | 0 | V$_{NWL}$ |
| 1 | 0 | 0 | V$_{NWL}$ |
| 1 | 1 | 0 | UNDEFINED |
| X | X | 1 | V$_{SS}$ |

| $FX_{k-1}$ | $FX_k$ | $FX_{k+1}$ | $MWLB_j$ | $MWLVSS_{k \times j}$ |
|---|---|---|---|---|
| 0 | 0 | 0 | 0 | $V_{SS}$ |
| 0 | 0 | 1 | 0 | $V_{NWL}$ |
| 0 | 1 | 0 | 0 | $V_{NWL}$ |
| 0 | 1 | 1 | 0 | UNDEFINED |
| 1 | 0 | 0 | 0 | $V_{NWL}$ |
| 1 | 0 | 1 | 0 | UNDEFINED |
| 1 | 1 | 0 | 0 | UNDEFINED |
| 1 | 1 | 1 | 0 | UNDEFINED |
| X | X | X | 1 | $V_{SS}$ |

SEMICONDUCTOR MEMORY DEVICE AND DRIVING METHOD THEREOF

CROSS-REFERENCE(S) TO RELATED APPLICATIONS

This application is a division of U.S. patent application Ser. No. 12/544,807 filed on Aug. 20, 2009 now U.S. Pat. No. 8,259,529, which claims priority of Korean Patent Application Nos. 10-2008-0081989 and 10-2009-0077212, filed on Aug. 21, 2008 and Aug. 20, 2009, respectively. The disclosure of each of the foregoing applications is incorporated herein by reference in their entirety.

BACKGROUND OF THE INVENTION

The present invention relates to a semiconductor design technology, and in particular, to a row path design of a semiconductor memory device. More particularly, the present invention relates to a negative word line driving technology.

A semiconductor memory device may be configured by a group of memory cells, which form basic units. A large number of memory cells are arrayed in a matrix form. A memory cell of a dynamic random access memory (DRAM), formed as a representative semiconductor memory device, includes one NMOS transistor and one capacitor.

FIG. 1 is a circuit diagram illustrating a configuration of a conventional DRAM cell.

Referring to FIG. 1, an NMOS transistor T of the DRAM cell has a gate connected to a word line WL, and a source connected to a bit line BL. A capacitor C of the DRAM cell has a storage node connected to a drain of the NMOS transistor T, and a plate node connected to a cell plate voltage terminal.

The word line WL is a signal line that is selected by a row address to select and activate a corresponding memory cell. When a certain word line WL is selected, a high voltage level (VPP) is applied to the selected word line WL so that a cell transistor T connected to the word line WL is turned on. A primary data transfer occurs through charge sharing between a storage node of a capacitor C and a bit line that is a signal line through which data is inputted or outputted. This is a basic active operation of the DRAM.

In a precharge operation of the DRAM, the word line WL selected in the active operation changes to a ground voltage level (VSS). Thus, the cell transistor T is turned off and data is stored in the storage node of the capacitor C.

Meanwhile, since the memory cell of the DRAM has a leakage current even if it is unselected, the stored data may be lost after elapse of a certain time. To prevent the loss of data, it is necessary to perform a refresh operation to amplify and restore data of the storage node at predetermined time intervals.

A characteristic time taken in physically losing data at the storage node is called a refresh characteristic. As the integration degree of a DRAM fabrication process is improved, the spacing between a memory cell and its adjacent part is gradually narrowed, causing increase of a leakage current at a storage node. In addition, as a capacitance of a storage node itself becomes smaller, the refresh characteristic is further degraded.

Meanwhile, a method of increasing a threshold voltage of a cell transistor may be used for reducing a leakage current at the cell transistor. However, if the threshold voltage of the cell transistor is increased, time taken to store data in the storage node is increased.

A negative word line scheme may improve refresh characteristic, without degrading characteristic of time taken to store data in a storage node, because a leakage current is controlled using a gate-source voltage (Vgs) relation of a cell transistor, without increasing its threshold voltage, by maintaining a potential of a word line to a negative potential lower than an existing ground voltage level (VSS) in a precharge state where a word line is unselected.

However, the negative word line scheme has a disadvantage in that current consumption increases according to increase of a potential variation width (swing width). That is, a selected word line is at an external high voltage level (VPP), and an unselected word line is at a negative word line voltage level (VBBW) lower than a ground voltage level (VSS). Hence, the potential variation width of the word line is increased compared with the case the negative word line scheme is not used. The current consumption increases. Also, an internal voltage circuit generating the high voltage and the negative word line voltage must manage a larger amount of current.

If a bit line and a word line are shorted, current consumption is increased by the application of the negative word line scheme.

Meanwhile, in the case of a transistor having a low threshold voltage, such as FinFET, it has been necessary to apply the negative word line scheme on an entire cell array. However, in the case of a transistor having a recessed channel structure, it has not been always necessary to apply the negative word line scheme on the entire cells because a threshold voltage is not lowered.

In such a structure, if the negative word line scheme is applied on the entire cells, a channel doping of the entire cells can be lowered and therefore a channel threshold voltage can be lowered. This means that the transistor has an appropriate current drivability even though the high voltage used as a word line driving voltage is lowered.

In this case, however, a neighbor gate effect that a channel voltage is fluctuated due to neighbor word lines may worsen. That is, if a selected word line is activated to a high voltage level, a channel area controlled by a neighbor word line sharing an active area with the selected word line experiences a large voltage rise because a channel doping is in a very low state by the application of the negative word line scheme. This degrades an off characteristic of the corresponding cell, resulting in increase of a leakage current.

Compared with a transistor having a planar channel structure, a transistor with a recessed channel structure may be affected more severely because a channel of a neighbor cell faces a word line passing aside. Moreover, compared with the transistor having the recessed channel structure, a transistor having a saddle gate structure may severely affect a channel of a neighbor cell.

Meanwhile, as the technology is advanced, the spacing between word lines gets narrower. In this case, a neighbor gate effect is becoming a more significant concern.

SUMMARY OF THE INVENTION

An embodiment of the present invention is directed to providing a semiconductor memory device, which prevents a neighbor gate effect in a negative word line scheme, and a method for driving the semiconductor memory device.

Another embodiment of the present invention is directed to providing a semiconductor memory device, which prevents increase of unnecessary current consumption in a negative word line scheme, and a method for driving the semiconductor memory device.

In accordance with an aspect of the present invention, there is provided a semiconductor memory device having a plurality of wordlines and a driver configured to, when a wordline of the plurality of wordlines is activated by an active command, drive at least one non-activated wordline neighboring the activated wordline and remaining non-activated wordlines with different wordline driving voltage levels during a period of time that the activated wordline is driven to a high voltage level.

In accordance with another aspect of the present invention, there is provided a method for driving a semiconductor memory device, which includes driving sub wordlines of a memory cell area, which includes a plurality of unit cell blocks, to a ground voltage level during a precharge period, and selectively driving at least one sub wordline neighboring an activated sub wordline to a negative voltage level during an active period.

In accordance with further aspect of the present invention, there provided a method for driving a semiconductor memory device, which includes driving sub wordlines of a memory cell area, which includes a plurality of unit cell blocks, to a first negative voltage level during a precharge period, and selectively driving at least one sub wordline neighboring an activated sub wordline to a second negative voltage level lower than the first negative voltage level, and driving remaining non-activated sub wordlines to the first negative voltage, during an active period.

In accordance with further aspect of the present invention, there is provided a method for driving a semiconductor memory device, which includes driving sub wordlines of a memory cell area, which includes a plurality of unit cell blocks, to a ground voltage level during a precharge period and, during an active period, driving sub wordlines of unit cell blocks, to which an activated sub wordline does not belong, to the ground voltage level, selectively driving non-activated sub wordlines of a unit cell block, to which the activated sub wordline belongs, to a first negative voltage level, and selectively driving at least one sub wordline neighboring the activated sub wordline among the non-activated sub wordlines of the unit cell block, to which the activated sub wordline belongs, to a second negative voltage level lower than the first negative voltage level.

In accordance with further aspect of the present invention, there is provided a method for driving a semiconductor memory device, which includes driving sub wordlines of a memory cell area, which includes a plurality of unit cell blocks, to a first negative voltage level during a precharge period, and, during an active period, driving sub wordlines of unit cell blocks, to which an activated sub wordline does not belong, to the first negative voltage level, selectively driving non-activated sub wordlines of a unit cell block, to which the activated sub wordline belongs, to a second negative voltage level lower than the first negative voltage level, and selectively driving at least one sub wordline neighboring the activated sub wordline among the non-activated sub wordlines of the unit cell block, to which the activated sub wordline belongs, to a third negative voltage level lower than the second negative voltage level.

In accordance with further aspect of the present invention, there is provided a semiconductor memory device, which includes a main wordline decoder configured to decode upper bits of a row address to generate a main wordline selection signal, a sub wordline selection line decoder configured to decode bits of the row address that are lower in the row address than the upper bits to generate a sub wordline selection signal, a main wordline driver configured to drive a plurality of main wordlines in response to the main wordline selection signal, a sub wordline selection line driver configured to drive a plurality of sub wordline selection lines in response to the sub wordline selection signal, a sub wordline off voltage line driver configured to drive a plurality of sub wordline off voltage lines with different voltage levels in response to the sub wordline selection signal or the main wordline selection signal, and a sub wordline driver configured to drive a plurality of sub wordlines in response to signals on the main wordlines, the sub wordline selection lines, and the sub wordline off voltage lines.

In accordance with further aspect of the present invention, there is provided a semiconductor memory device, which includes a main wordline decoder configured to decode upper bits of a row address to generate a main wordline selection signal, a sub wordline selection line decoder configured to decode bits of the row address that are lower in the row address than the upper bits to generate a sub wordline selection signal, a main wordline driver configured to drive a plurality of main wordlines in response to the main wordline selection signal, a sub wordline selection line driver configured to drive a plurality of sub wordline selection lines in response to the sub wordline selection signal, a sub wordline off voltage line driver configured to drive a plurality of sub wordline off voltage lines, which are allocated based on unit cell block, with different voltage levels in response to a plurality of block active signals corresponding to a plurality of unit cell blocks, and a sub wordline driver configured to drive a plurality of sub wordlines in response to signals on the main wordlines, the sub wordline selection lines, and the sub wordline off voltage lines.

DESCRIPTION OF SPECIFIC EMBODIMENTS

Other objects and advantages of the present invention can be understood by the following description, and become apparent with reference to the embodiments of the present invention.

Figure 1:
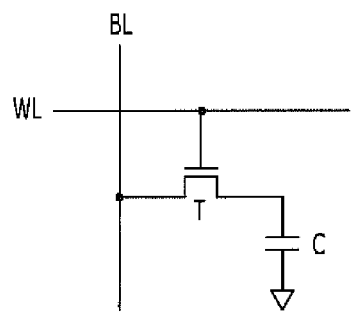
FIG. 1 is a circuit diagram illustrating a configuration of a conventional DRAM cell.
Figure 2A:
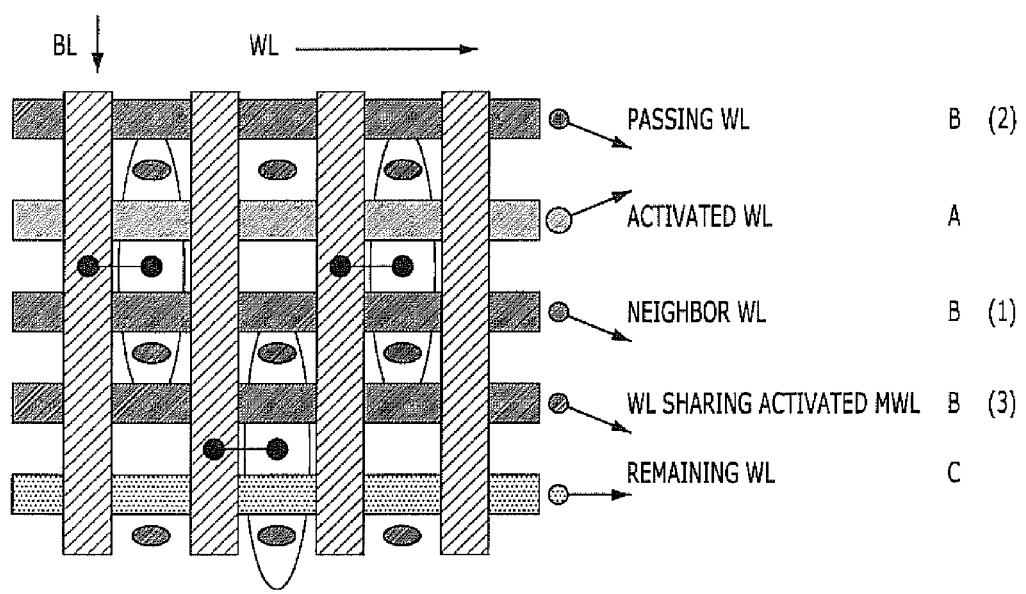
FIG. 2A is a layout diagram explaining a cell array in accordance with an embodiment of the present invention.

FIG. 2A is a layout diagram explaining a cell array in accordance with an embodiment of the present invention.

Referring to FIG. 2A, when a certain word line A is activated by an active command, word lines B, which are neighbors to (or affected by) the activated word line A, and the remaining word lines C (word lines other than the word lines B among the non-activated word lines) are driven by different levels of word line driving voltages during a period where the activated word line A is driven to a high voltage level (VPP).

The term "word line" used herein may refer to a sub word line (SWL) in a hierarchical word line structure. A word line driving voltage level for the word lines B that are neighbors to the activated word line A may be lower than the word line driving voltage level for the remaining word lines C.

Meanwhile, the sub word lines B neighboring (or affected by) the activated sub word line A may include a neighbor sub word line B(1) sharing an active area with the activated sub word line A, a passing sub word line B(2) passing an isolation area neighboring the activated sub word line A, non-activated sub word lines B(3) sharing a main word line (MWL) corresponding to the activated sub word line A. The remaining word lines C are non-activated sub word lines of a unit cell block to which the activated sub word line A belongs, which constitutes unit memory area corresponding to a unit bit line sense amp block and a unit sub word line driver block.

Figure 2B:
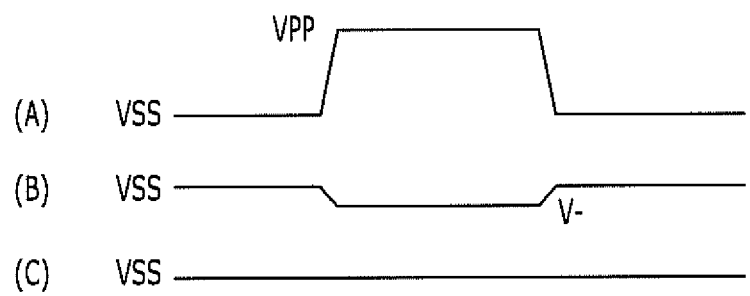
FIG. 2B is a waveform diagram of word line driving voltages for explaining a selective negative word line scheme in accordance with a first embodiment of the present invention.

FIG. 2B is a waveform diagram of word line driving voltages for explaining a selective negative word line scheme in accordance with a first embodiment of the present invention.

Referring to FIG. 2B, in the selective negative word line scheme in accordance with the first embodiment of the present invention, the entire sub word lines are driven to a ground voltage level (VSS) in a precharge state.

Then, when a certain sub word line is activated by an active command, the corresponding sub word line is driven to a high voltage level (VPP) during an active period, as illustrated in a portion (A) of FIG. 2B. In this case, the sub word line neighboring (or affected by) the activated sub word line among the non-activated sub word lines is driven to a negative voltage level (V−), for example, −0.2 V, as illustrated in a portion (B) of FIG. 2B. The remaining non-activated sub word lines maintain a ground voltage level (VSS), as illustrated in a portion (C) of FIG. 2B. As the sub word line driven to the negative voltage level (V−) among the non-activated sub word lines, only the neighbor sub word line may be selected, or the passing sub word line as well as the neighbor sub word line may be selected. Furthermore, the entire sub word lines sharing the main word line (MWL) corresponding to the activated sub word line may be selectively driven to the negative voltage level (V−), or the non-activated sub word lines of the unit cell block to which the activated sub word line belongs may be selectively driven to the negative voltage level (V−).

After the active period, the entire sub word lines are precharged to the ground voltage level (VSS).

As such, if the negative word line scheme is selectively applied only to the sub word line neighboring (or affected by) the activated sub word line among the non-activated sub word lines, a neighbor gate effect is improved more efficiently, compared with a typical negative word line scheme that precharges the entire non-activated sub word lines to a negative voltage level. Moreover, increase of unnecessary current consumption, which is the problem of the typical negative word line scheme, is prevented, and power stability is ensured.

Figure 2C:
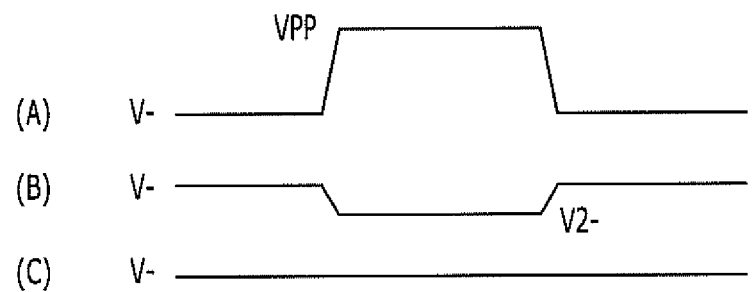
FIG. 2C is a waveform diagram of word line driving voltages for explaining a selective negative word line scheme in accordance with a second embodiment of the present invention.

FIG. 2C is a waveform diagram of word line driving voltages for explaining a selective negative word line scheme in accordance with a second embodiment of the present invention.

Referring to FIG. 2C, in the selective negative word line scheme in accordance with the second embodiment of the present invention, the entire sub word lines are driven to a first negative voltage level (V−), for example, −0.2 V, in a precharge state.

Then, when a certain sub word line is activated by an active command, the corresponding word line is driven to a high voltage level (VPP) during an active period, as illustrated in a portion (A) of FIG. 2C. In this case, the sub word line neighboring (or affected by) the activated sub word line among the non-activated sub word lines is driven to a second negative voltage level (V2−), for example, −0.4 V, which is lower than the first negative voltage level (V−), as illustrated in a portion (B) of FIG. 2C. The remaining non-activated sub word lines maintain the first negative voltage level (V−), as illustrated in a portion (C) of FIG. 2C. As the sub word line driven to the second negative voltage level (V2−) among the non-activated sub word lines, only the neighboring sub word line may be selected, or the passing sub word line as well as the neighboring sub word line may be selected. Furthermore, the entire sub is word lines sharing the main word line (MWL) corresponding to the activated sub word line may be selectively driven to the second negative voltage level (V2−), or the non-activated sub word lines of the unit cell block to which the activated sub word line belongs may be selectively driven to the second negative voltage level (V2−).

After the active period, the entire sub word lines are precharged to the first negative voltage level (V−).

As such, while being consistent with the typical negative word line scheme that precharges the entire sub word lines to the negative voltage level (V−), the negative word line scheme in accordance with the second embodiment of the present invention selectively drives the sub word line neighboring (or affected by) the activated sub word line among the non-activated sub word lines to the relatively lower negative voltage level (V2−). In using the typical negative word line scheme, it may be difficult to overcome the current consumption and power stability problems. However, according the second embodiment of the present invention, even though the high voltage level (VPP) is lowered, a large current drivability is exhibited, and an average cell leakage current is lowered. Moreover, a leakage current problem caused by a neighbor gate effect is also improved.

Figure 3:
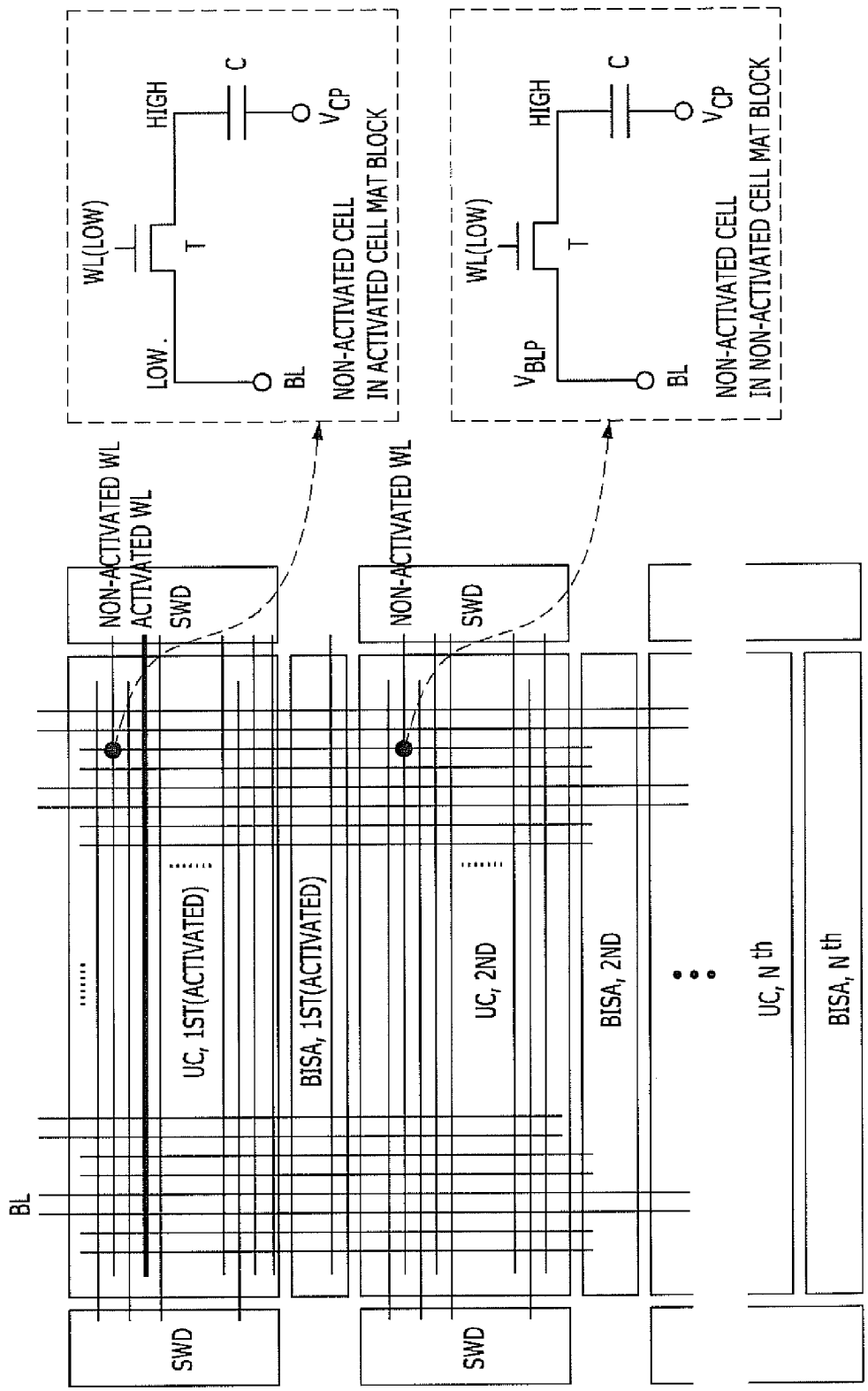
FIG. 3 is a block diagram illustrating a configuration of a memory cell area of a DRAM.

FIG. 3 is a block diagram illustrating a configuration of a memory cell area of a DRAM according to an embodiment of the present invention.

Referring to FIG. 3, a memory cell area is configured so that a plurality of unit cell blocks (also referred to as cell matrix/mat blocks) UC and a plurality of unit bit line sense amp blocks BISA corresponding to the unit cell blocks are alternately arranged. Meanwhile, sub word line driver blocks SWD configured to drive sub word lines of the corresponding unit cell block are arranged on both sides of each of the unit cell blocks.

When a certain sub word line is activated by an active command, data stored in a cell capacitor C connected to the activated sub word line is sensed. At this time, a potential of a bit line BL is dropped from a bit line precharge voltage level (VBLP=VCORE/2) to a ground voltage level (VSS=0 V). Consequently, a source voltage of a cell transistor T is dropped. Therefore, in the case of a non-activated cell transistor, if a bit line voltage is dropped in such a state that a word line is constantly maintained at a ground voltage level (VSS) and a substrate bias is also constantly maintained at a back bias voltage level (VBB), a gate-source voltage (Vgs) is increased and a body-source voltage (Vbs) is lowered, and thus, a threshold voltage is lowered.

A difference between the activated unit cell block (the activated cell mat block) and the non-activated unit cell block (the non-activated cell mat block) in the above-described operations can be confirmed. A leakage current occurring during a retention operation within the activated unit cell block in that state is called a dynamic retention current. The dynamic retention current is considerably larger than a leakage current occurring during a retention operation within the non-activated unit cell block. To improve the leakage current characteristic due to a lowered threshold voltage, a threshold voltage is increased by increasing a channel doping of a cell where the dynamic retention current occurs. In this manner, an off current of the cell is reduced. However, threshold voltages of the cells of the non-activated unit cell block are higher due to an excessive channel doping. Consequently, to improve the leakage current characteristic of a specific unit cell block, the cells of the remaining unit cell blocks have high threshold voltages due to excessively high channel doping.

In the above-described first and second embodiments, the selective driving (two-stage) of the unit cell block to which the activated sub word line belongs has been described.

Selective negative word line schemes in accordance with third and fourth embodiments of the present invention are (three-stage) schemes to selectively drive an activated unit cell block and a non-activated unit cell block and selectively drive a sub word line neighboring an activated sub word line within the activated unit cell block.

In the selective negative word line scheme in accordance with the third embodiment of the present invention, sub word lines of the entire unit cell blocks are driven to a ground voltage level (VSS) in a precharge state.

Then, when a certain sub word line is activated by an active command, the activated sub word line is driven to a high voltage level (VPP) during an active period. At this time, sub word lines of the unit cell blocks to which the activated sub word line does not belong maintain a ground voltage level (VSS), and non-activated sub word lines of the unit cell block to which the activated sub word line belongs are driven to a first negative voltage level (V−). Among the non-activated sub word lines, a sub word line neighboring (or affected by) the activated sub word line is driven to a second negative voltage level (V2−) lower than the first negative voltage level (V−). For the sub word line driven to the second negative voltage level (V2−) among the non-activated sub word lines, only the neighboring sub word line may be selected, or a passing sub word line as well as the neighboring sub word line may be selected. Also, the entire word lines sharing a main word line (MWL) corresponding to the activated sub word line may be selectively driven to the second negative voltage level (V2−).

After the active period, the sub word lines of the entire unit cell blocks are precharged to the ground voltage level (VSS).

As such, the selective negative driving operation is performed on the activated unit cell block and the non-activated unit cell block, and simultaneously, the selective negative driving operation is performed on the non-activated sub word lines of the activated unit cell block according to whether they are neighboring the activated sub word line. In this manner, a neighbor gate effect is improved, and increase of unnecessary current consumption is prevented. Furthermore, power stability is ensured. Moreover, it is possible to solve the problem that the cells of the remaining unit cell blocks have high threshold voltages due to excessively high channel doping in order to improve a leakage current characteristic of a specific unit cell block.

In the selective negative word line scheme in accordance with the fourth embodiment of the present invention, sub word lines of the entire unit cell blocks are driven to a first negative voltage level (V−) in a precharge state.

Then, when a certain sub word line is activated by an active command, the activated sub word line is driven to a high voltage level (VPP) during an active period. At this time, sub word lines of the unit cell blocks to which the activated sub word line does not belong maintain the first negative voltage level (V−), and non-activated sub word lines of the unit cell block to which the activated sub word line belongs are driven to a second negative voltage level (V2−) lower than the first negative voltage level (V−). Among the non-activated sub word lines, a sub word line neighboring (or affected by) the activated sub word line is driven to a third negative voltage level (V3−) lower than the second negative voltage level (V2−). For the sub word line driven to the third negative voltage level (V3−) among the non-activated sub word lines, only the neighbor sub word line may be selected, or a passing sub word line as well as the neighbor sub word line may be selected. Also, the entire word lines sharing a main word line (MWL) corresponding to the activated sub word line may be selectively driven to the third negative voltage level (V3−).

After the active period, the sub word lines of the entire unit cell blocks are precharged to the first negative voltage level (V−).

As such, while the negative driving operation is basically performed on the sub word lines, the selective negative driving operation is performed on the activated unit cell block and the non-activated unit cell block, and simultaneously, the selective negative driving operation is performed on the non-activated sub word lines of the activated unit cell block according to whether they are neighboring the activated sub word line. In this case, despite the existence of the current consumption and power stability concerns present in the typical negative word line scheme to a certain degree, a neighbor gate effect is improved. Furthermore, current drivability is improved, and an average cell leakage current is reduced. Moreover, it is possible to prevent a problem where the cells of the remaining unit cell blocks have high threshold voltages due to excessively high channel doping in order to improve a leakage current characteristic of a specific unit cell block.

Figure 4:
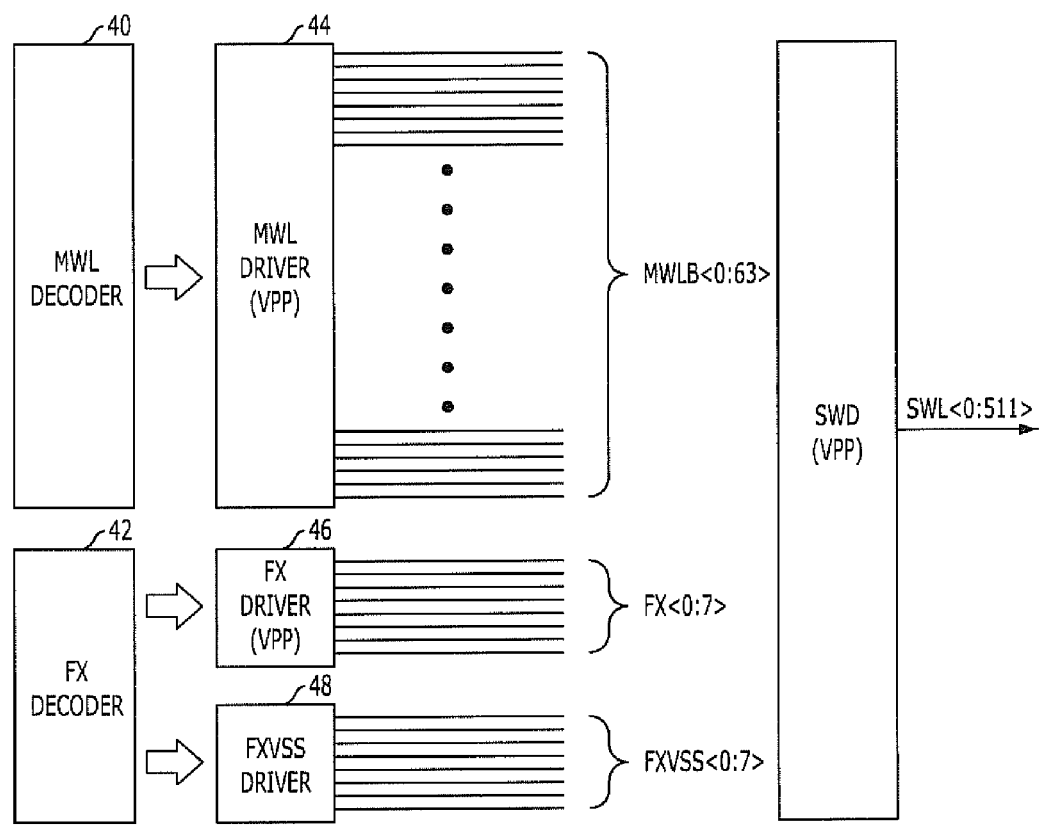
FIG. 4 is a block diagram illustrating a circuit configuration of a row path of a DRAM in accordance with a fifth embodiment of the present invention.

FIG. 4 is a block diagram illustrating a circuit configuration of a row path of a DRAM in accordance with a fifth embodiment of the present invention.

Referring to FIG. 4, the row path of the DRAM in accordance with the embodiment of the present invention includes a main wordline (MWL) decoder 40, a sub wordline selection line (FX) decoder 42, an MWL driver 44, a FX driver 46, a sub wordline off voltage line (FXVSS) driver 48, and a sub wordline driver SWD. The MWL decoder 40 decodes predetermined upper bits of a row address to generate a main wordline selection signal. The FX decoder 42 decodes predetermined lower bits of the row address to generate a sub wordline selection signal. The MWL driver 44 drives main wordlines MWLB<0:63> in response to the main wordline selection signal outputted from the MWL decoder 40. The FX driver 46 drives sub wordline selection lines FX<0:7> (although not shown, including complementary lines FXB<0:7> of the sub wordline selection lines FX<0:7>) in response to the sub wordline selection signal outputted from the FX decoder 42. The FXVSS driver 48 drives sub wordline off voltage lines FXVSS<0:7> with different voltage levels in response to the sub wordline selection signal. The sub wordline driver SWD drives sub wordlines SWL<0:511> in response to signals of the main wordlines MWLB<0:63>, the sub wordline selection lines FX<0:7> and FXB<0:7>, and the sub wordline off voltage lines FXVSS<0:7>. The activation levels of the output signals of the MWL driver 44, the FX driver 46, and the sub wordline driver SWD are high voltage level (VPP).

The current embodiment may be easily implemented by partial modification of the sub wordline driver SWD and the hole area in the row path. In general, the number of the sub wordlines SWL equals m×n through m:n coding where m is the number of the main wordlines MWL and n is the number of the sub wordline selection lines FX. In the case of the current embodiment (m=64, n=8), eight sub wordline off voltage lines FXVSS are further provided so that they are arranged in parallel to be paired with each of the eight sub wordline selection lines FX and FXB, and the FXVSS driver is implemented so that a negative voltage is selectively applied to the sub wordline off voltage lines FXVSS. The sub wordline off voltage lines FXVSS are connected to an off voltage terminal of the sub wordline driver SWD.

Figure 5:
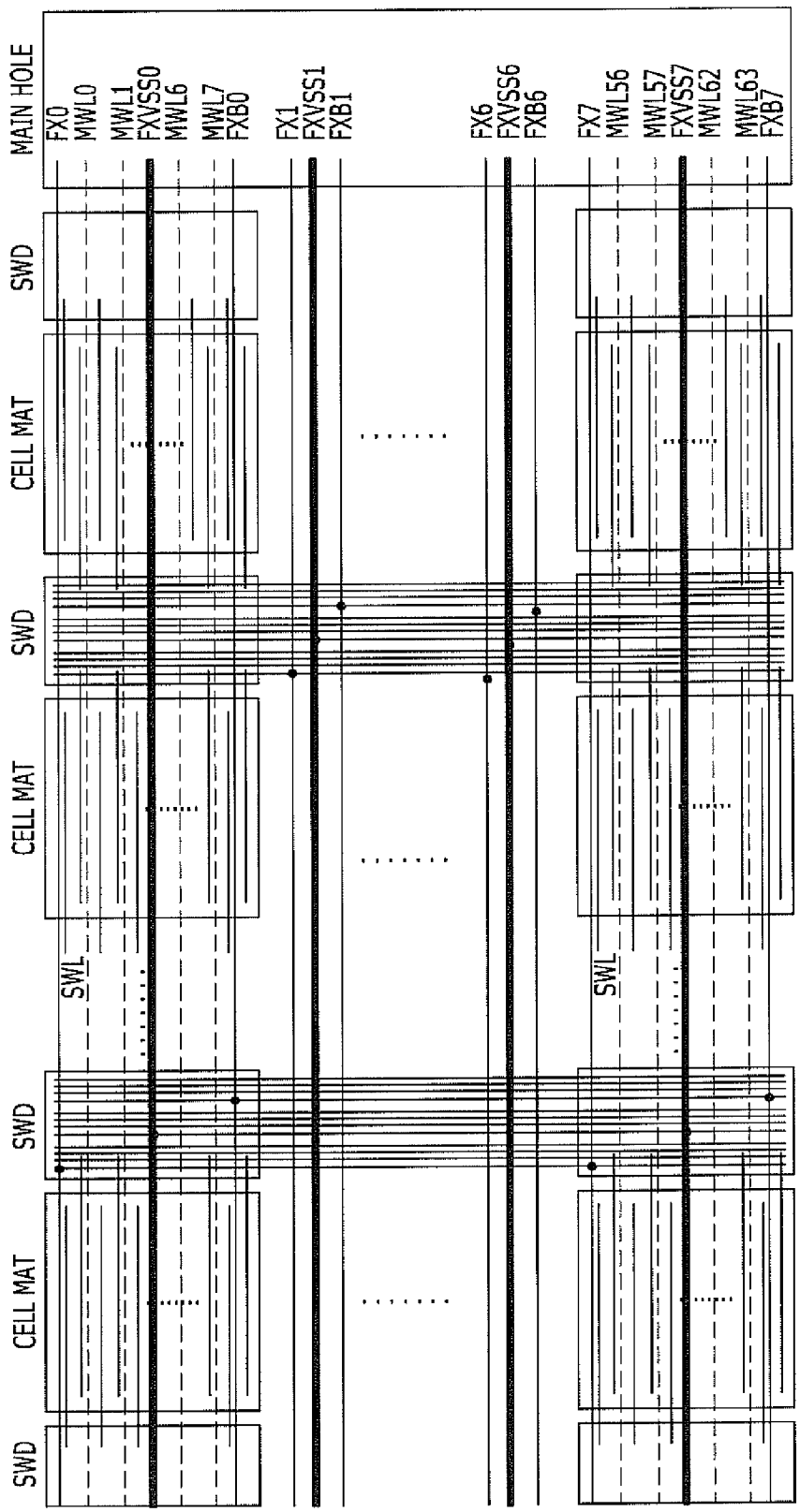
FIG. 5 illustrates a line arrangement for the wordline driving scheme in accordance with the fifth embodiment of the present invention.

FIG. 5 illustrates a line arrangement for the wordline driving scheme in accordance with the fifth embodiment of the present invention.

Referring to FIG. 5, the newly added eight sub wordline off voltage lines FXVSS are paired with the existing eight sub wordline off selection lines FX and arranged in parallel, respectively.

Figure 6:
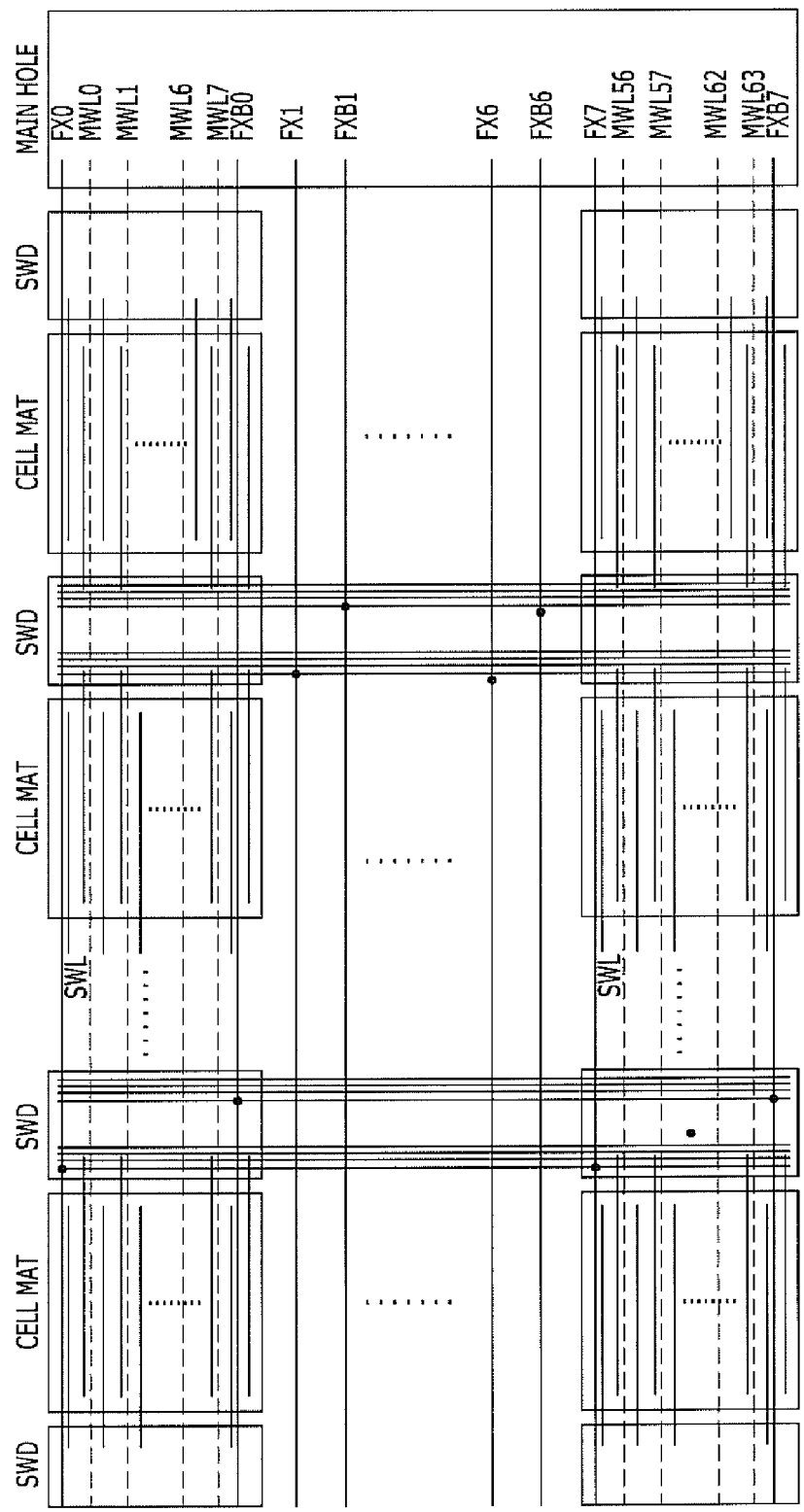
FIG. 6 illustrates a line arrangement for the typical wordline driving scheme.

FIG. 6 illustrates a line arrangement for the typical wordline driving scheme. The fifth embodiment of the present invention can be understood more easily with reference to FIG. 6.

Meanwhile, in the current embodiment, when a specific sub wordline selection lines FX<k> is activated by an active command, a negative voltage is selectively applied to the sub wordline off voltage lines FXVSS corresponding to non-activated sub wordline selection lines FX that are disposed as neighbors to the activated line FX<k>. Accordingly, when a specific sub wordline SWL is activated by a combination of a main wordline MWL and a sub wordline selection line FX, a negative voltage may be selectively applied to non-activated sub wordlines neighboring the activated sub wordline.

As described in the foregoing embodiments, the sub wordline selection lines FX neighboring the activated sub wordline selection line FX<k> may be defined in various manners.

Figure 7A:
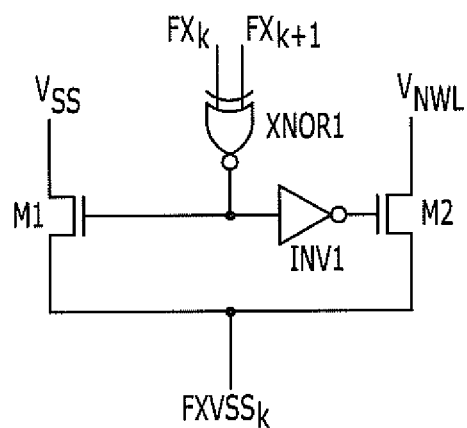
FIGS. 7A and 7B illustrate implementation examples of an FXVSS driver in accordance with a fifth embodiment of the present invention, which defines an FX line neighboring an activated FX line.
Figure 7B:
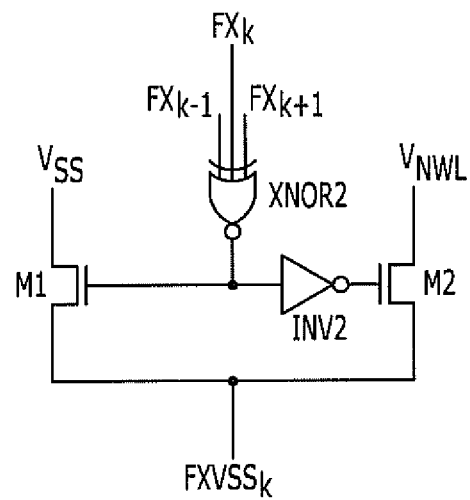

FIGS. 7A and 7B illustrate implementation examples of the FXVSS driver 48 in accordance with the fifth embodiment of the present invention, according to the manners of defining the lines FX neighboring the activated line FX<k>.

Specifically, FIG. 7A illustrates a case of selectively applying a negative voltage only to a neighbor sub wordline, and FIG. 7B illustrates a case of selectively applying a negative voltage to a passing sub wordline as well as a neighbor sub wordline.

Referring to FIGS. 7A and 7B, the FXVSS driver 48 includes a first NMOS transistor M1, a second NMOS transistor M2, and a control unit. The first NMOS transistor M1 is configured to transfer a ground voltage $V_{SS}$ to a sub wordline off voltage line FXVSS. The second NMOS transistor M2 is configured to transfer a negative voltage $V_{NWL}$ to the sub wordline off voltage line FXVSS. The control unit is configured to control the switching operations of the first NMOS transistor M1 and the second NMOS transistor M2.

In the case of FIG. 7A, the control unit includes an exclusive NOR gate XNOR1 and an inverter INV1. The exclusive NOR gate XNOR1 is configured to receive a signal of a corresponding sub wordline selection line $FX_k$ and a signal of a next sub wordline selection line $FX_{k+1}$. The inverter INV1 is configured to invert an output signal of the exclusive NOR gate XNOR1 and apply the inverted output signal of the exclusive NOR gate XNOR1 to a gate of the second NMOS transistor M2.

As shown in a truth table set forth together with the circuit diagram of FIG. 7A, when both the signal of the corresponding line $FX_k$ and the signal of the next line $FX_{k+1}$ are non-activated (0/0), the ground voltage $V_{SS}$ is transferred to the corresponding sub wordline off voltage line $FXVSS_k$. When the signal of the next line $FX_{k+1}$ is activated (0/1), the negative voltage $V_{NWL}$ is transferred to the corresponding sub wordline off voltage line $FXVSS_k$. When the signal of the corresponding line $FX_k$ is activated (1/0), selection of either one of the ground voltage $V_{SS}$ and the negative voltage $V_{NWL}$ makes no difference because the sub wordline is driven to the high voltage $V_{PP}$ not the wordline off voltage.

Since a case where both the signal of the corresponding line $FX_k$ and the signal of the next line $FX_{k+1}$ are activated (1/1) does not exist, it is not considered.

In the case of FIG. 7B, the control unit includes an exclusive NOR gate XNOR2 and an inverter INV2. The exclusive NOR gate XNOR2 is configured to receive a signal of a corresponding sub wordline selection line $FX_k$, a signal of a previous sub wordline selection line $FX_{k-1}$, and a signal of a next sub wordline selection line $FX_{k+1}$. The inverter INV2 is configured to invert an output signal of the exclusive NOR gate XNOR2 and apply the inverted output signal of the exclusive NOR gate XNOR2 to a gate of the second NMOS transistor M2.

As shown in a truth table set forth together with the circuit diagram of FIG. 7B, when the signal of the corresponding line $FX_k$, the signal of the next line $FX_{k+1}$, and the signal of the previous line $FX_{k-1}$ are all non-activated (0/0/0), the ground voltage $V_{SS}$ is transferred to the corresponding sub wordline off voltage line $FXVSS_k$. When the signal of the next line $FX_{k+1}$ is activated only (0/0/1), or the signal of the previous line $FX_{k-1}$ is activated only (1/0/0), the negative voltage $V_{NWL}$ is transferred to the corresponding sub wordline off voltage line $FXVSS_k$.

Meanwhile, the FXVSS driver 48 in accordance with the fifth embodiment of the present invention includes the circuit of FIG. 7A or 7B as many as the number of the sub wordline off voltage lines (n=8). Also, the ground voltage $V_{SS}$ may be replaced with the first negative voltage (V−), and the negative voltage $V_{NWL}$ may be replaced with the second negative voltage (V2−).

In accordance with a sixth embodiment of the present invention, the number of the sub wordline off voltage lines FXVSS is set to n×m(=512), instead of n(=8) as illustrated in FIG. 4, and the sub wordline off voltage lines FXVSS are in 1:1 correspondence to the sub wordline drivers. In this case, compared with the above-described fifth embodiment, the number of the sub wordline off voltage lines FXVSS increases, but current consumption is reduced because the FXVSS driver 48 selectively negative-drives only the sub wordline corresponding to the activated main wordline signals MWLB<0:63>.

Figure 8A:
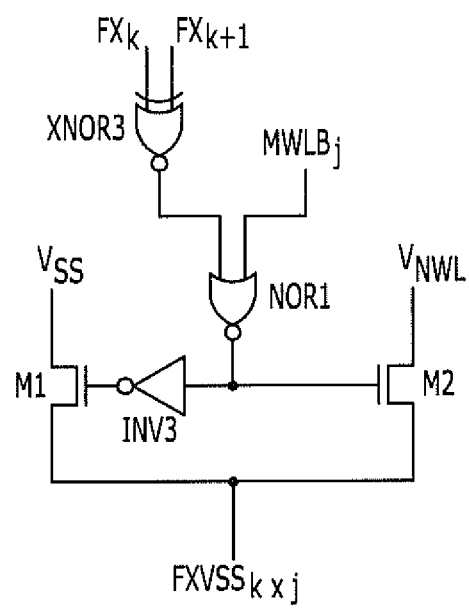
FIGS. 8A and 8B illustrate implementation examples of an FXVSS driver in accordance with a sixth embodiment of the present invention, which defines an FX line neighboring an activated FX line.
Figure 8B:
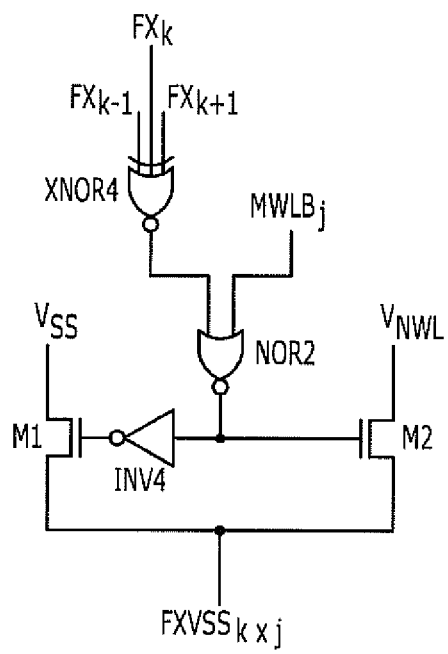

FIGS. 8A and 8B illustrate implementation examples of the FXVSS driver 48 in accordance with the sixth embodiment of the present invention, according to the manner of defining the sub wordline selection lines FX neighboring the activated sub wordline selection line FX<k>.

Specifically, FIG. 8A illustrates a case of selectively applying a negative voltage only to a neighboring sub wordline, and FIG. 8B illustrates a case of selectively applying a negative voltage to a passing sub wordline as well as a neighbor sub wordline.

Referring to FIGS. 8A and 8B, the FXVSS driver 48 includes a first NMOS transistor M1, a second NMOS transistor M2, and a control unit. The first NMOS transistor M1 is configured to transfer a ground voltage $V_{SS}$ to a sub wordline off voltage line FXVSS. The second NMOS transistor M2 is configured to transfer a negative voltage $V_{NWL}$ to the sub wordline off voltage line FXVSS. The control unit is configured to control the switching operations of the first NMOS transistor M1 and the second NMOS transistor M2.

In the case of FIG. 8A, the control unit includes an exclusive NOR gate XNOR3, a NOR gate NOR1, and an inverter INV3. The exclusive NOR gate XNOR3 is configured to receive a signal of a corresponding sub wordline selection line $FX_k$ and a signal of a next sub wordline selection line $FX_{k+1}$. The NOR gate NOR1 is configured to receive an output signal of the exclusive NOR gate XNOR gate XNOR3 and a corresponding main wordline signal MWLBj. The inverter INV3 is configured to invert an output signal of the NOR gate NOR1 and apply the inverted output signal of the NOR gate XNOR1 to a gate of the first NMOS transistor M1.

As shown in a truth table set forth together with the circuit diagram of FIG. 8A, on the assumption that the corresponding main wordline signal MWLBj is in an activated state of a logic low level, when both the signal of the corresponding line $FX_k$ and the signal of the next line $FX_{k+1}$ are non-activated (0/0), the ground voltage $V_{SS}$ is transferred to the corresponding sub wordline off voltage line $FXVSS_{kxj}$. Based on the same assumption, when the signal of the next line $FX_{k+1}$ is activated (0/1), the negative voltage $V_{NWL}$ is transferred to the corresponding sub wordline off voltage line $FXVSS_{kxj}$. When the corresponding main wordline signal MWLBj is deactivated to a logic high level, the ground voltage $V_{SS}$ is transferred to the corresponding sub wordline off voltage line $FXVSS_{kxj}$, without regard to the states of the signal of the corresponding line $FX_k$ and the signal of the next line $FX_{k+1}$.

In the case of FIG. 8B, the control unit includes an exclusive NOR gate XNOR4, a NOR gate NOR2, and an inverter INV4. The exclusive NOR gate XNOR4 is configured to receive a signal of a corresponding sub wordline selection line $FX_k$, a signal of a previous sub wordline selection line $FX_{k-1}$, and a signal of a next sub wordline selection line $FX_{k+1}$. The NOR gate NOR2 is configured to receive an output signal of the exclusive NOR gate XNOR4 and a corresponding main wordline signal MWLBj. The inverter INV4 is configured to invert an output signal of the NOR gate NOR2 and apply the inverted output signal of the NOR gate NOR2 to a gate of the first NMOS transistor M1.

As shown in a truth table set forth together with the circuit diagram of FIG. 8B, on the assumption that the corresponding main wordline signal MWLBj is in an activated state of a logic low level, when the signal of the corresponding line $FX_k$, the signal of the previous line $FX_{k-1}$, and the signal of the next line $FX_{k+1}$ are all non-activated (0/0/0), the ground voltage $V_{SS}$ is transferred to the corresponding sub wordline off voltage line $FXVSS_{kxj}$. Based on the same assumption, when the signal of the previous line $FX_{k-1}$ or the signal of the next FX line $FX_{k+1}$ is activated only (1/0/0 or 0/0/1), the negative voltage $V_{NWL}$ is transferred to the corresponding sub wordline off voltage line $FXVSS_{kxj}$. When the corresponding main wordline signal MWLBj is deactivated to a logic high level, the ground voltage $V_{SS}$ is transferred to the corresponding sub wordline off voltage line $FXVSS_{kxj}$, without regard to the states of the signal of the previous line $FX_{k-1}$, the signal of the corresponding line $FX_k$, and the signal of the next line $FX_{k+1}$.

Meanwhile, in the sixth embodiment of the present invention, the ground voltage $V_{SS}$ may be replaced with the first negative voltage (V−), and the negative voltage $V_{NWL}$ may be replaced with the second negative voltage (V2−).

Figure 9:
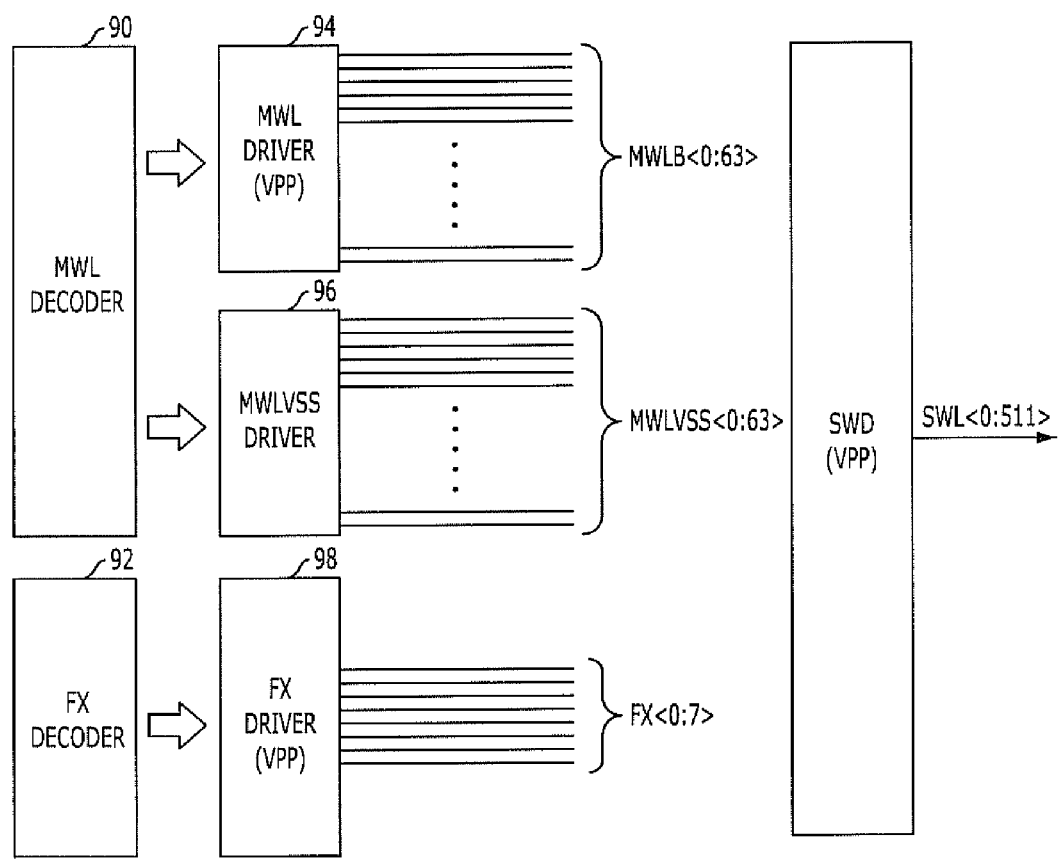
FIG. 9 is a block diagram illustrating a circuit configuration of a row path of a DRAM in accordance with a seventh embodiment of the present invention.

FIG. 9 is a block diagram illustrating a circuit configuration of a row path of a DRAM in accordance with a seventh embodiment of the present invention.

Referring to FIG. 9, the row path of the DRAM in accordance with the embodiment of the present invention includes an MWL decoder 90, a FX decoder 92, an MWL driver 94, a wordline off voltage line (MWLVSS) driver 96, a FX driver 98, and a sub wordline driver SWD. The MWL decoder 90 decodes predetermined upper bits of a row address to generate a main wordline selection signal. The FX decoder 92 decodes predetermined lower bits of the row address to generate a sub wordline selection signal. The MWL driver 94 drives main wordlines MWLB<0:63> in response to the main wordline selection signal outputted from the MWL decoder 90. The MWLVSS driver 96 drives wordline off voltage lines MWLVSS<0:63> with different voltage levels in response to the main wordline selection signal. The FX driver 98 drives sub wordline selection lines FX<0:7> (although not shown, including complementary lines FXB<0:7> of the sub wordline selection lines FX<0:7>) in response to the sub wordline selection signal outputted from the FX decoder 92. The sub wordline driver SWD drives sub wordlines SWL<0:511> in response to signal of the main wordlines MWLB<0:63>, the sub wordline selection lines FX<0:7> and FXB<0:7>, and the wordline off voltage lines MWLVSS<0:63>. The activation levels of the output signals of the MWL driver 94, the FX driver 98, and the sub wordline driver SWD are equal to the high voltage level (VPP).

The seventh embodiment has a similar structure to the fifth embodiment. However, while the fifth embodiment is configured so that the sub wordline off voltage lines FXVSS<0:7> are paired with the sub wordline selection lines FX and arranged in parallel, the seventh embodiment is configured so that the wordline off voltage lines MWLVSS<0:63> are paired with the main wordlines MWL and arranged in parallel. The wordline off voltage lines MWLVSS are connected to an off voltage terminal of the sub wordline driver SWD.

Figure 10:
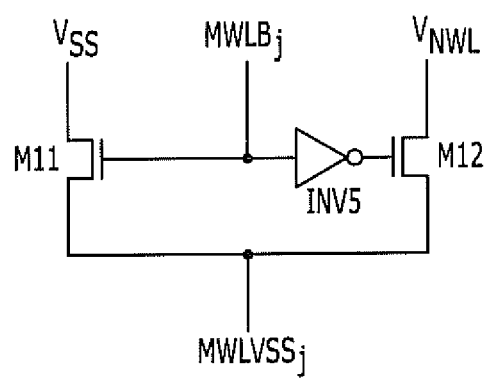
FIG. 10 illustrates an implementation example of an MWLVSS driver in accordance with a seventh embodiment of the present invention.

FIG. 10 illustrates an exemplary implementation of the MWLVSS driver 96 in accordance with the seventh embodiment of the present invention.

Referring to FIG. 10, the MWLVSS driver 96 includes a first NMOS transistor M11, an inverter INV5, and a second NMOS transistor M12. The first NMOS transistor M11 is configured to transfer the ground voltage $V_{SS}$ to the corresponding wordline off voltage line $MWLVSS_j$ in response to the corresponding main wordline selection signal $MWLB_j$. The inverter INV5 is configured to invert the corresponding main wordline selection signal $MWLB_j$. The second NMOS transistor M12 is configured to transfer the negative voltage $V_{NWL}$ to the corresponding wordline off voltage line MWLVSS$_j$ in response to the inverted main wordline selection signal outputted from the inverter INV5.

In this case, when the corresponding main wordline selection signal MWLB$_j$ is activated ("0"), non-activated sub wordlines among sub wordlines sharing the corresponding main wordline MWLB<j> are driven to the negative voltage $V_{NWL}$, and the remaining sub wordlines belonging to the non-activated ("1") main wordline selection signals, that do not share the corresponding main wordline MWLB<j>, are driven to the ground voltage $V_{SS}$. For reference, the MWLVSS driver 96 in accordance with the current embodiment includes the circuit of FIG. 10 as many as the number of the main wordlines (m=64).

Meanwhile, in accordance with the eighth embodiment of the present invention, the number of the wordline off voltage lines MWLVSS is set to n×m(=512), instead of m(=64) as illustrated in FIG. 9, and the wordline off voltage lines MWLVSS are in 1:1 correspondence to the sub wordline drivers. In this case, compared with the above-described seventh embodiment, the number of the wordline off voltage lines MWLVSS increases, but current consumption is reduced because the MWLVSS driver 96 selectively negative-drives only the sub wordlines corresponding to the activated main wordline selection signals MWLB.

Figure 11A:
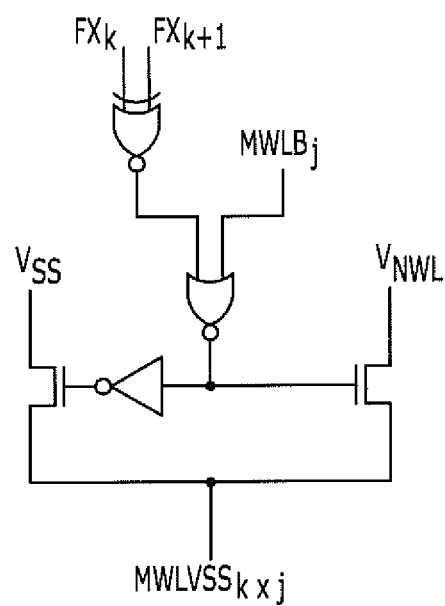
FIGS. 11A and 11B illustrate implementation examples of an MWLVSS driver in accordance with an eighth embodiment of the present invention, which defines an FX line neighboring an activated FX line.
Figure 11B:
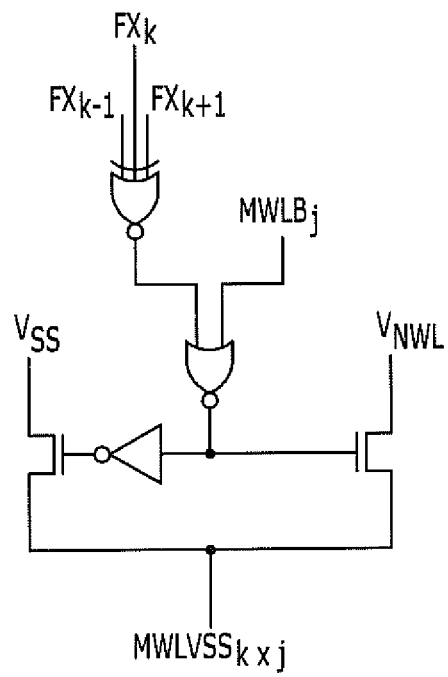

FIGS. 11A and 11B illustrate implementation examples of the MWLVSS driver 96 in accordance with the eighth embodiment of the present invention, according to the manner of defining the sub wordline selection lines FX neighboring the activated sub wordline selection line FX<k>. The MWLVSS driver 96 has the substantially same circuit configuration and truth tables as those of FIGS. 8A and 8B, except that the sub wordline off voltage lines FXVSS are replaced with the wordline off voltage lines MWLVSS, and therefore, its detailed description will be omitted.

It has been described in the foregoing embodiments that non-activated sub wordlines within the unit cell block to which the activated sub wordline belongs are selectively driven to the negative voltage (V− or V2−).

Assuming that the number of the unit cell blocks is n, a wordline off voltage line VSS_BLOCK_N is arranged to correspond to each of the n unit cell blocks, and a selective negative wordline driving is performed in response to a block active signal CBA_N that is generated using a block address (a portion of most significant bits of a row address).

Figure 12:
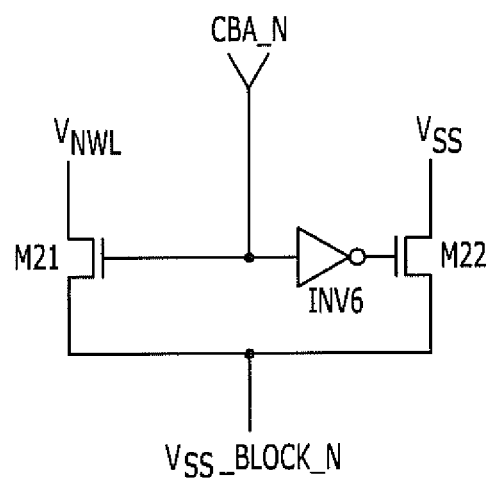
FIG. 12 is a circuit diagram of an MWLVSS driver in accordance with a ninth embodiment of the present invention.

FIG. 12 is a circuit diagram of an MWLVSS driver in accordance with a ninth embodiment of the present invention.

Referring to FIG. 12, the MWLVSS driver includes a first NMOS transistor M21, an inverter INV6, and a second NMOS transistor M22. The first NMOS transistor M21 is configured to transfer a negative voltage $V_{NWL}$ to a corresponding wordline off voltage line VSS_BLOCK_N in response to a corresponding block active signal CBA_N. The inverter INV6 is configured to invert the corresponding block active signal CBA_N. The second NMOS transistor M22 is configured to transfer a ground voltage $V_{SS}$ to the corresponding wordline off voltage line VSS_BLOCK_N in response to the inverted block active signal outputted from the inverter INV6.

When an $n^{th}$ unit cell block is selected and activated, the negative voltage $V_{NWL}$ is transferred to the wordline off voltage line VSS_BLOCK_N corresponding to the $n^{th}$ unit cell block, and the remaining wordline off voltage lines are driven to the ground voltage $V_{SS}$. Meanwhile, the ground voltage $V_{SS}$ may be replaced with the first negative voltage (V−), and the negative voltage $V_{NWL}$ may be replaced with the second negative voltage (V2−).

Figure 13A:
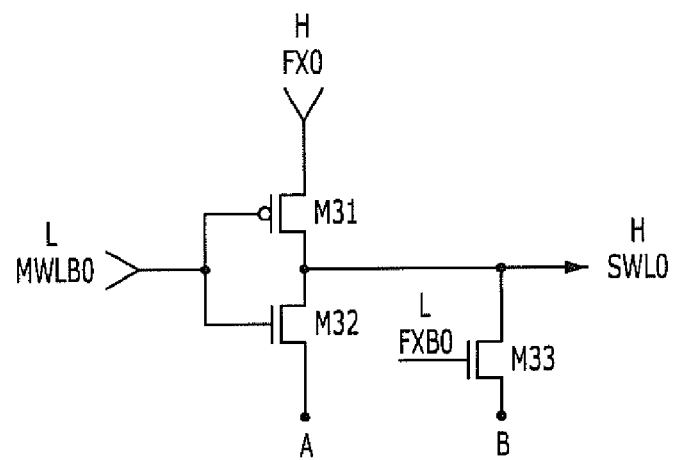
FIGS. 13A and 13B are circuit diagrams of a sub wordline driver.
Figure 13B:
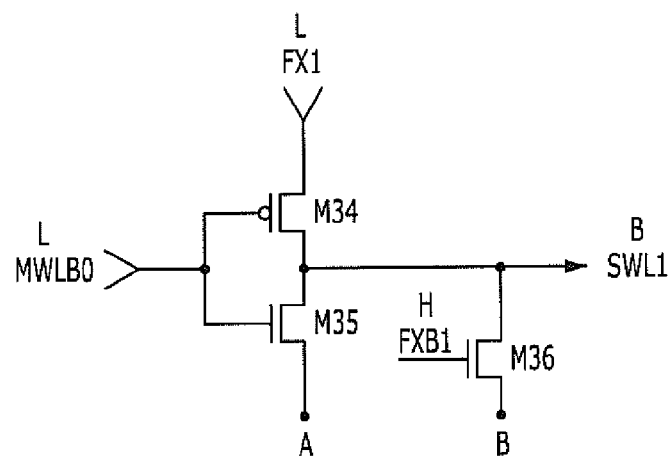

FIGS. 13A and 13B are circuit diagrams of the sub wordline driver SWD.

Specifically, FIG. 13A is a circuit diagram of illustrating a voltage application state of a sub wordline driver corresponding to an activated sub wordline, and FIG. 13B is a circuit diagram of illustrating a voltage application state of a sub wordline driver corresponding to a non-activated sub wordline.

Referring to FIG. 13A, when an active command is applied and a specific sub wordline SWL0 is selected, a main wordline signal MWLB0 is activated to a logic low level, and a sub wordline selection signal FX0 is activated to a logic high level (VPP level). Therefore, a PMOS transistor M31 is turned on, and two NMOS transistors M32 and M33 are turned off, so that the sub wordline SWL0 is activated to a logic high level (VPP level).

Referring to FIG. 13B, when another sub wordline SWL1 shares the main wordline signal MWLB0, the main wordline signal MWLB0 is activated to a logic low level, and the sub wordline selection signal FX1 is deactivated to a logic low level (VSS level). Therefore, an NMOS transistor M35 is turned off, and a PMOS transistor M34 is turned on. An NMOS transistor M36 is also turned on, so that the sub wordline SWL1 is driven to a level of an off voltage terminal B.

Meanwhile, since a main wordline signal MWLB corresponding to a non-selected main wordline is at a logic high level, the pull-down NMOS transistors M32 and M35 are turned on, so that the corresponding sub wordline SWL is driven to a level of an off voltage terminal A.

The ground voltage ($V_{SS}$) terminal or the wordline off voltage line FXVSS (MWLVSS) may be connected to the off voltage terminal A and the wordline off voltage line FXVSS (MWLVSS) may be connected to the off voltage terminal B according to the above-described embodiments.

While the present invention has been described with respect to the specific embodiments, it will be apparent to those skilled in the art lo that various changes and modifications may be made without departing from the spirit and scope of the invention as defined in the following claims.

What is claimed is:

1. A method for driving a semiconductor memory device, the method comprising:
    driving sub wordlines of a memory cell area, which includes a plurality of unit cell blocks, to a ground voltage level during a precharge period; and
    selectively driving at least one sub wordline neighboring an activated sub wordline to a negative voltage level during an active period,
    wherein non-activated sub wordlines other than the at least one sub wordline neighboring the activated sub wordline are driven to the ground voltage level during the active period,
    wherein the activated sub wordline is driven to a high voltage level during the active period, and
    wherein the at least one sub wordline neighboring the activated sub wordline includes sub wordlines sharing a main wordline corresponding to the activated sub wordline.

2. The method of claim 1, wherein the at least one wordline neighboring the activated sub wordline comprises a neighbor sub wordline sharing an active area with the activated sub wordline.

3. The method of claim 2, wherein the at least one sub wordline neighboring the activated sub wordline further comprises a passing sub wordline passing an isolation area neighboring the activated sub wordline.

4. The method of claim 1, wherein the at least one sub wordline neighboring the activated sub wordline includes sub wordlines of a unit cell block to which the activated sub wordline belongs.

5. A method for driving a semiconductor memory device, the method comprising:
- driving sub wordlines of a memory cell area, which includes a plurality of unit cell blocks, to a ground voltage level during a precharge period; and
- during an active period,
- driving sub wordlines of unit cell blocks, to which an activated sub wordline does not belong, to the ground voltage level;
- selectively driving non-activated sub wordlines of a unit cell block, to which the activated sub wordline belongs, to a first negative voltage level; and
- selectively driving at least one sub wordline neighboring the activated sub wordline among the non-activated sub wordlines of the unit cell block, to which the activated sub wordline belongs, to a second negative voltage level lower than the first negative voltage level.

6. The method of claim 5, wherein the activated sub wordline is driven to a high voltage level during the active period.

7. The method of claim 6, wherein the at least one sub wordline neighboring the activated sub wordline comprises a neighboring sub wordline sharing an active area with the activated sub wordline.

8. The method of claim 7, wherein the at least one sub wordline neighboring the activated sub wordline further comprises a passing sub wordline passing an isolation area neighboring the activated sub wordline.

9. The method of claim 6, wherein the at least one sub wordline neighboring the activated sub wordline includes sub wordlines sharing a main wordline corresponding to the activated sub wordline.

* * * * *